US006714145B1

United States Patent
Marques

(10) Patent No.: US 6,714,145 B1
(45) Date of Patent: Mar. 30, 2004

(54) METHOD AND APPARATUS FOR INTEGER-BASED ENCODING AND DECODING OF BITS

(76) Inventor: Richard Marques, 524 Kingsport Dr., Gurnee, IL (US) 60031

( * ) Notice: Subject to any disclaimer, the term of this patent is extended or adjusted under 35 U.S.C. 154(b) by 0 days.

(21) Appl. No.: 10/254,908

(22) Filed: Sep. 26, 2002

(51) Int. Cl.[7] .............................................. H03M 7/00
(52) U.S. Cl. ............................ 341/50; 341/60; 341/87; 341/51
(58) Field of Search .......................... 341/50, 51, 87, 341/67

(56) References Cited

U.S. PATENT DOCUMENTS

| | | | |
|---|---|---|---|
| 3,914,586 A | 10/1975 | McIntosh | 235/154 |
| 3,976,844 A | 8/1976 | Betz | 179/15.55 |
| 4,021,782 A | 5/1977 | Hoerning | 340/172.5 |
| 4,054,951 A | 10/1977 | Jackson et al. | 364/900 |
| 4,087,788 A | 5/1978 | Johannesson | 340/146.3 |
| 4,286,256 A | 8/1981 | Langdon, Jr. et al. | 340/347 |
| 4,295,125 A | 10/1981 | Langdon, Jr. | 340/347 |
| 4,366,551 A | 12/1982 | Holtz | 364/900 |
| 4,412,306 A | 10/1983 | Moll | 364/900 |
| 4,463,342 A | 7/1984 | Langdon, Jr. et al. | 340/347 |
| 4,464,650 A | 8/1984 | Eastman et al. | 340/347 |
| 4,467,317 A | 8/1984 | Langdon, Jr. et al. | 340/347 |
| 4,491,934 A | 1/1985 | Heinz | 364/900 |
| 4,494,108 A | 1/1985 | Langdon, Jr. et al. | 340/347 |
| 4,558,302 A | 12/1985 | Welch | 340/347 |
| 4,560,976 A | 12/1985 | Finn | 340/347 |
| 4,586,027 A | 4/1986 | Tsukiyama et al. | 340/347 |
| 4,597,057 A | 6/1986 | Snow | 364/900 |
| 4,612,532 A | 9/1986 | Bacon et al. | 340/347 |
| 4,622,545 A | 11/1986 | Atkinson | 340/747 |
| 4,633,490 A | 12/1986 | Goertzel et al. | 375/122 |
| 4,652,856 A | 3/1987 | Mohiuddin et al. | 340/347 |
| 4,677,649 A | 6/1987 | Kunishi et al. | 375/122 |
| 4,682,150 A | 7/1987 | Mathes et al. | 340/347 |
| 4,701,745 A | 10/1987 | Waterworth | 340/347 |
| 4,730,348 A | 3/1988 | MacCrisken | 375/122 |
| 4,758,899 A | 7/1988 | Tsukiyama | 360/8 |
| 4,809,350 A | 2/1989 | Shimoni et al. | 382/56 |
| 4,814,746 A | 3/1989 | Miller et al. | 341/95 |
| 4,853,696 A | 8/1989 | Mukherjee | 341/65 |
| 4,872,009 A | 10/1989 | Tsukiyama et al. | 341/95 |
| 4,876,541 A | 10/1989 | Storer | 341/51 |
| 4,891,643 A | 1/1990 | Mitchell et al. | 341/107 |
| 4,905,297 A | 2/1990 | Langdon, Jr. et al. | 382/56 |
| 4,906,991 A | 3/1990 | Fiala et al. | 341/51 |
| 4,935,882 A | 6/1990 | Pennebaker et al. | 364/554 |
| 4,941,193 A | 7/1990 | Barnsley et al. | 382/56 |
| 4,943,869 A | 7/1990 | Horikawa et al. | 358/426 |
| 4,955,066 A | 9/1990 | Notenboom | 382/56 |

(List continued on next page.)

FOREIGN PATENT DOCUMENTS

JP  2-46275  2/1990

OTHER PUBLICATIONS

Kevin Dickson, "White Paper: Cisco IOS Data Compression", posted Jul. 1, 2000 and printed Mar. 15, 2002 (18 pages).

*Primary Examiner*—Jean Jeanglaude
(74) *Attorney, Agent, or Firm*—McDonnell Boehnen Hulbert & Berghoff

(57) ABSTRACT

A method and apparatus for encoding a block of bits as integers values. A bit may be parsed from the block of bits. If the bit has a first value, then a first integer value of a data array may be selected to encode the bit. The first integer value may have a predefined characteristic, e.g., be an odd value. Alternatively, if the bit has a second value, then a second integer value of the data array may be selected to encode the bit. The second integer value might not have the predefined characteristic, e.g., not be an odd value, and instead be an even value. A set of integer values resulting from the encoding of the block of bits may define a compressed data block. The compressed data block may then be subsequently decoded to recover the block of bits.

34 Claims, 3 Drawing Sheets

U.S. PATENT DOCUMENTS

| | | | |
|---|---|---|---|
| 4,973,961 A | 11/1990 | Chamzas et al. | 341/51 |
| 4,988,998 A | 1/1991 | O'Brien | 341/55 |
| 5,001,478 A | 3/1991 | Nagy | 341/67 |
| 5,003,307 A | 3/1991 | Whiting et al. | 341/51 |
| 5,016,009 A | 5/1991 | Whiting et al. | 341/67 |
| 5,023,611 A | 6/1991 | Chamzas et al. | 341/51 |
| 5,025,258 A | 6/1991 | Duttweiler | 341/107 |
| 5,049,881 A | 9/1991 | Gibson et al. | 341/95 |
| 5,051,745 A | 9/1991 | Katz | 341/51 |
| 5,065,447 A | 11/1991 | Barnsley et al. | 382/56 |
| 5,109,433 A | 4/1992 | Notenboom | 382/40 |
| 5,126,739 A | 6/1992 | Whiting et al. | 341/106 |
| 5,140,321 A | 8/1992 | Jung | 341/55 |
| 5,155,484 A | 10/1992 | Chambers, IV | 341/55 |
| 5,179,378 A | 1/1993 | Ranganathan et al. | 341/51 |
| 5,229,768 A | 7/1993 | Thomas | 341/51 |
| 5,347,600 A | 9/1994 | Barnsley et al. | 382/56 |
| 5,384,867 A | 1/1995 | Barnsley et al. | 382/56 |
| 5,416,856 A | 5/1995 | Jacobs et al. | 382/232 |
| 5,430,812 A | 7/1995 | Barnsley et al. | 382/235 |
| 6,400,289 B1 | 6/2002 | Banerji | 341/60 |

METHOD AND APPARATUS FOR INTEGER-BASED ENCODING AND DECODING OF BITS

BACKGROUND

1. Field of the Invention

The present invention relates to data communications, and more particularly to a method and system for integer-based encoding and integer-based decoding of bits by data encoders and data decoders, respectively.

2. Description of Related Art

Wireless networks and data networks transmit and receive massive amounts of data. As a result, the wireless networks and the data networks use encoders and decoders to reduce an amount of the data exchanged through the wireless networks and the data networks. The encoders and the decoders permit improved speed of transmission through the wireless networks and the data networks.

The encoders implement several types of encoding schemes to reduce the amount of data exchanged. For example, Huffman encoding can be used to reduce the amount of data exchanged. The Huffman encoding technique represents symbols (i.e., numbers or characters) contained in the data as variable length code words. The code words are assigned based on the probability of occurrence of the symbols. Short code words represent symbols that appear more frequently in the data while long code words represent symbols that appear less frequently in the data. A reduction in the data exchanged through the wireless networks and the data networks is achieved when short code words are used with a higher frequency to encode the data as compared to long code words.

Lempel-Ziv is another example of an encoding technique that encoders can use to reduce the amount of data exchanged. The Lempel-Ziv encoding technique involves representing, as a code word, repeating sequences of symbols contained in the data, rather than just repeating symbols. Frequently occurring repeating sequences of symbols are encoded as a short code word while infrequently repeating sequences of symbols are encoded as a long code word. Similarly, the reduction in the amount of data exchanged is achieved when short code words are used with a high frequency to replace frequently occurring repeating sequences of symbols.

SUMMARY

The present invention stems from a realization that the existing encoding techniques rely on characteristics of the data being encoded. For example, the Huffman encoding technique and the Lempel-Ziv encoding technique depend on a high frequency of repeating symbols and a high frequency of repeating sequences of symbols, respectively, in the data being encoded to achieve compression. Additionally, the existing encoding techniques use a large amount of memory. The large amount of memory stores a mapping of the symbols or the sequences of symbols to the code words. Therefore, there exists a need for a method and system to be able to efficiently encode the data without the limitations and the requirements of existing encoding schemes.

In accordance with a principle aspect of the present invention, an encoder may store in memory a data array having a first integer value and a second integer value. The first integer value and the second integer value may, collectively, simulate a binary condition. For example, the first integer value may have a predefined characteristic, e.g., be odd, and the second integer value might not have the predefined characteristic, e.g., not be odd, and instead be even. The encoder may encode a single bit as the first integer value or the second integer value. For example, if the single bit is a zero, then the encoder may encode the single bit as the even integer value of the data array. On the other hand, if the single bit is a one, then the encoder may encode the single bit as the odd integer value of the data array.

Additionally, the encoder may have at least one register for keeping track of a number of bits equal to one that was encoded and a number of bits equal to zero that was encoded. If a zero bit is encoded, then the integer value of a first register may be adjusted, e.g., increased or decreased. Alternatively, if a one bit is encoded, then the integer value of a second register may be adjusted, e.g., increased or decreased.

Still additionally, the encoder may have registers for storing integer values with predetermined properties. The predetermined properties may be that the integer values are either a multiple of an integer factor F or the multiple of the integer factor F plus the integer factor F minus one. The integer factor, F, may be a predefined number selected for purposes of the encoding. The integer values in the registers may be adjusted as one or more bits in the block of bits are encoded while maintaining the predetermined properties.

The encoder may encode a block of bits to produce a compressed data block. The compressed data block may include at least one integer value. The at least one integer value may be defined by the registers that store the integer values with the predetermined properties.

A decoder may decode the at least one integer value in the compressed data block to recover the block of bits. The decoder may also have at least one register. The decoder may set the at least one register to the at least one integer value in the compressed data block.

The decoder may generate a first integer value or a second integer value from the at least one integer value in the at least one register. Similar to the encoder, the first integer value may have a predefined characteristic, e.g., odd, and the second integer might not have the predefined characteristic, e.g., not odd, and instead even.

If the decoder generates the first integer value, e.g., an odd number, then the decoder may decode a one bit from the compressed data block. Alternatively, if the decoder generates the second integer value, e.g., an even number, then the decoder may decode a zero bit from the compressed data block. Additionally, the decoder may adjust integer values in the at least one register to maintain the predetermined properties during the encoding of the block of bits as one or more bits in the compressed data block is decoded.

These as well as other aspects and advantages will become apparent to those of ordinary skill in the art by reading the following detailed description, with appropriate reference to the accompanying drawings.

BRIEF DESCRIPTION OF THE DRAWINGS

Exemplary embodiments of the present invention are described herein with reference to the drawings, in which.

DETAILED DESCRIPTION OF EXEMPLARY EMBODIMENTS

Figure 1:
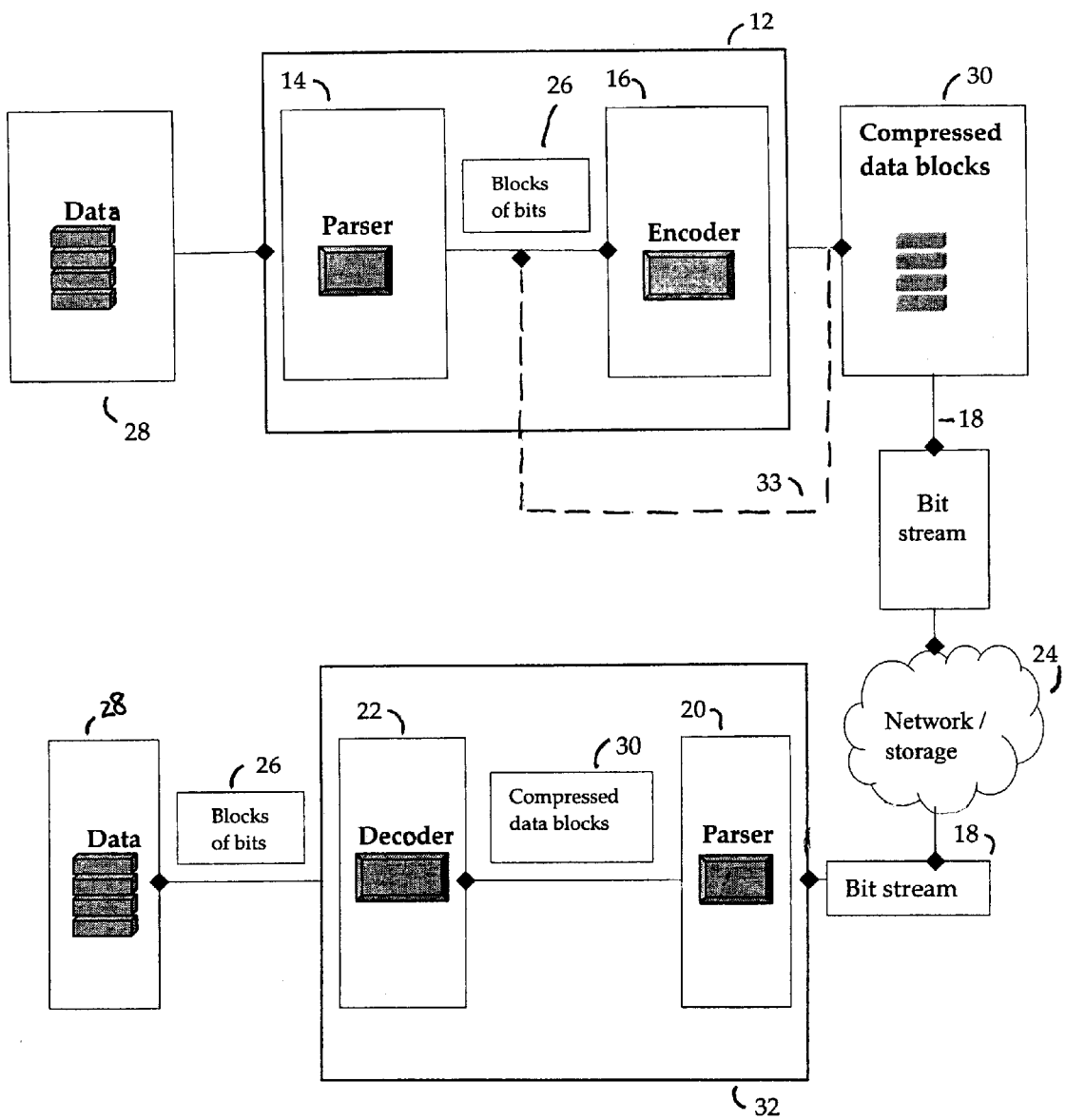
FIG. 1 illustrates an exemplary network architecture for encoding and decoding a block of bits.

Referring to the drawings, FIG. 1 illustrates an exemplary network architecture in which exemplary embodiments of the present invention may be employed. Those skilled in the art will appreciate that other network architectures can be used instead, additional elements may be added to these network architectures, and some elements may be omitted altogether. Further, those skilled in the art will appreciate that many of the elements described herein may be functional entities implemented as discrete components or in conjunction with other components, in any suitable combination and location. Still further, the various functions described herein as being performed by one or more entities may be carried out by a processor programmed to execute computer instructions stored in memory. Provided with the present disclosure, those skilled in the art can readily prepare the computer instructions (e.g., software) to perform such functions.

By way of example, the encoding architecture 12 may consist of a parser 14 and an encoder 16. The parser 14 may be physically separate, as shown, or integrated into the encoder 16. The parser 14 may segment data 28 to be encoded. The data 28 to be encoded may be from one or more bit streams. The parser 14 may parse the data 28 into blocks of bits 26. The block of bits 26 may have a predetermined number of bits. The predetermined number of bits in the block of bits 26 may be based on a size of registers, to be described herein, in the encoder. For example, if the size of the registers is 10 bits, then the maximum integer value that can be stored in the register is 1024. As a result, the encoder 24 may be able to encode, at a time, a block of bits having a maximum number of 1024 bits.

The parser 14 may send the blocks of bits 26 to the encoder 16. The blocks of bits 26 sent to the encoder 16 may be all of the same size (i.e., same number of bits) or a variable size with a number of bits less than or equal to the maximum integer value.

The encoder 16 may encode a single block of bits, thereby producing a single compressed data block. The single compressed data block may represent the single block of bits. The compressed data block 30 may have a fixed size regardless of the number of bits in the block of bits 26 that is encoded.

Optionally, the compressed data block 30 may be re-encoded by the encoder 16. The compressed data block output of the encoder 16 may be sent over path 33 to the input of the encoder 16. As a result, the encoder 16 may be configured to allow for further encoding, and thus further compression, of a previously compressed data block.

Then, the compressed data block 30 may be transported over a network 24 or stored in storage 24. The compressed data blocks 30 for the blocks of bits 26 may be combined, e.g., multiplexed, together to form a compressed bit stream 18, which is transported over the network 24 or stored in the storage 24.

Again, by way of example, the decoding architecture 32 may consist of a parser and a decoder 22. Unlike the parser 16, the parser 20 may parse the compressed bit stream 18 to produce the compressed data blocks 30. Again, the parser 20 may be physically separate, as shown, or integrated into the decoder 22. The compressed data blocks 30 may be input into the decoder 22. The decoder 22 may decode a single compressed data block to produce a single block of bits and, thus, the data 28. Additionally, the data 28 may be combined or separated, e.g., multiplexed or demultiplexed, to produce one or more bit streams.

The Encoder For Encoding the Data

Figure 2:
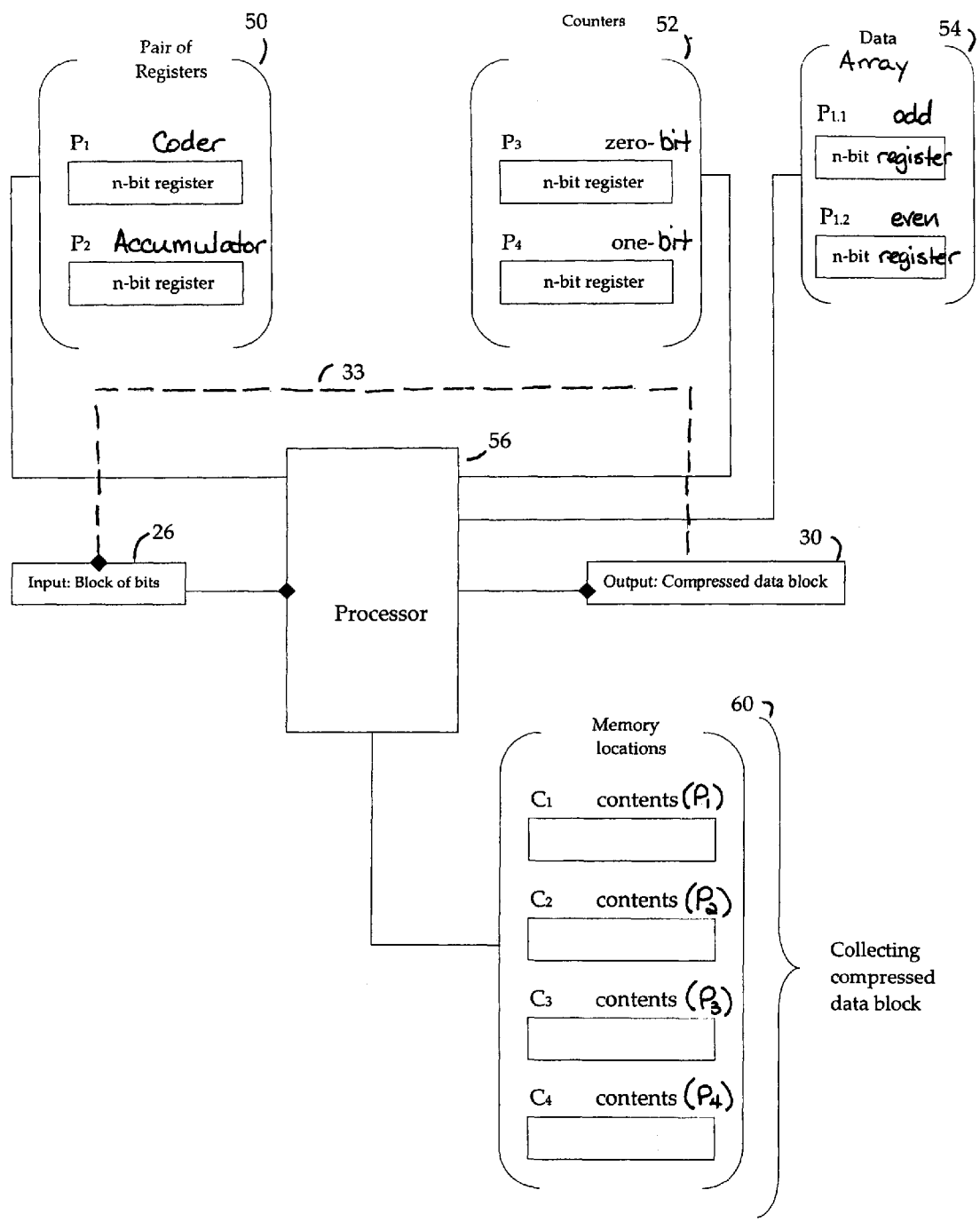
FIG. 2 is an overview of an internal architecture for an encoder that encodes the blocks of bits into compressed data blocks.

FIG. 2 illustrates an exemplary architecture for the encoder 16. As noted, the encoder 16 may encode the block of bits 26 into the compressed data block 30. The encoder 16 may have a processor 56 coupled to one or more registers. The registers may be storage devices, e.g., integer registers, floating point registers, or memory locations, which store integer values. The processor 56 may perform integer calculations (e.g., truncation of any decimal produced as a result of a division operation) on the integer values in the registers to encode the blocks of bits 26 into the compressed data blocks 30.

The encoder 16 of FIG. 2 is shown to have a pair of registers 50, a data array 54, counters 52, and memory 60. The pair of registers 50, the data array 54, and the counters 52 may each consist of two registers and the memory 60 may consist of four locations, C1 to C4. Other arrangements, however, are also possible. The exemplary embodiments of the present invention are not limited by the number of registers or the number of memory locations in the encoder 16.

The pair of registers 50 may be identified by registers P1 and P2 in FIG. 2. As described below, the registers P1 and P2 may be used to generate integer values of the data array 54. Additionally, the register P1 may be adjusted as a bit is encoded. And the register P2 may accumulate adjustments made to the register P1.

In an alternative exemplary embodiment, the encoder (and decoder as described below) need not use two registers P1 and P2 to generate the integer values of the data array. The integer values may be generated using a single register or more than two registers. The use of multiple registers prevents the integer value of a single register from quickly overflowing or underflowing during generation of the integer values of the data array 54.

Registers P1.1 and P1.2 may store the integer values of the data array 54. As described in more detail below, the integer values may have or might not have a predefined characteristic, e.g., oddness, evenness, multiple of a number. For example, the register P1.1 may store an odd integer value and the register P1.2 may store an even integer value. Alternatively, the register P1.1 may store an even integer value and the register P1.2 may store an odd integer value. Other variations are also possible.

The counters 52 may consist of registers P3 and P4. The processor 56 may use the register P3 and P4 to count the number of zero-bits encoded and the number of one-bits encoded, respectively, by the encoder 16. Other arrangements are also possible.

The integer values of one or more of the registers in the encoder 16 may have predetermined properties. As each bit of the block of bits is encoded, the processor 56 may maintain the predetermined properties of the one or more registers.

The predetermined properties may be based on an integer factor F programmed into the encoder 16. The integer factor F may be a number, e.g., non-zero and preferably four, which the processor 56 may use to maintain the predetermined properties of the one or more registers. Additionally, the processor 56 may also define an integer factor F1 and an integer factor F2. The integer factor F1 may be twice the integer factor F and the integer factor F2 may be three times the integer factor F, e.g., F1 equals 8 and F2 equals 12, but other arrangements are also possible.

Prior to encoding each bit of the block of bits, the integer value of P1 may have the predetermined property of being a multiple of the integer factor F plus the integer factor F minus one. And the integer value of P2 may have the predetermined property of being the multiple of the integer factor F.

The encoder 16 may parse out a single bit from the block of bits 26 and encode the single bit. The single bit may have a value of one or zero. The processor 56 may encode the single bit as one of the two integer values defined by registers P1.1 and P1.2.

As noted above, one of the two integer values may have a predefined characteristic. The predefined characteristic may simulate a base-two condition of the bit that is to be encoded. For example, the data array may have an odd integer value and an even integer value. The bit may be encoded as the odd integer value or the even integer value of the data array 54 depending on whether the single bit is the zero or the one. If the single bit is the one, then the processor 56 may encode the bit as the odd integer value stored by P1.1. If the single bit is the zero, then the processor 56 may encode the bit as the even integer value stored by P1.2. Alternatively, if the single bit is a zero, then the processor 56 may encode the bit as the even integer value stored by P1.1. If the single bit is a one, then the processor 56 may encode the bit as the odd integer value stored by P1.2.

Other arrangements are also possible. For example, the data array may have a first integer that is a multiple of a number and a second integer that is not a multiple of the number. For example, the data array may have numbers such as 19 and 21, where 19 is not a multiple of 3 and 21 is. Likewise, a zero bit and a one bit may be exclusively encoded as the first integer or the second integer, e.g., a zero bit encoded as not a multiple of 3 and a one bit encoded as the multiple of 3. Other variations are also possible to simulate the base-two condition.

The encoding of the bit may be accomplished, in part, by adjusting the integer value of registers P3 and P4. The registers P3 and P4 may keep track of whether the single bit to be encoded is encoded, for example, as the odd integer value or the even integer value of the data array 54. If the single bit is a zero, then the processor may adjust, e.g., increment or decrement, the integer value of P3 to correspond to selection of the odd value in P1.1. If the single bit is a one, however, then the processor 56 may adjust, e.g., increment or decrement, the integer value of P4 to correspond to selection of the even value in P1.2. Other arrangements are also possible.

Additionally, as described in more detail below, the processor 56 may re-establish the integer values of registers P1 and P2. The processor 56 may use the factors F1 and F2 multiplied by the integer values stored in P3 and P4, respectively, to re-establish the integer values of P1 and P2 prior to encoding a next bit in the block of bits. The integer values of P1 and P2 may be re-established to maintain the predetermined properties during the encoding of the block of bits. Additionally, the integer registers of P1 and P2 may be re-established to control the size of the integer values defined by the integer registers.

By encoding the bits in the block of bits, the registers P1, P2, P3, and P4 may define unique integer values representing the block of bits. The integer values of the registers P1, P2, P3, P4 resulting from the encoding of the bits in block of bits may be stored in memory 60. For example, the integer value of P1 may be stored at memory location C1, the integer value of P2 may be stored at memory location C2, the integer value of P3 may be stored at memory location C3, and the integer value of P4 may be stored at memory location C4.

The processor 56 may combine one or more of the integer values stored in the memory 60 to generate the compressed data block 30. For example, the contents at memory location C1 may be combined with the contents at memory location C2. And the combined contents of C1 and C2 may be combined with the contents at memory location C3 and the contents at memory location C4. The encoder 16 may then output the compressed data block 30 as the integer values in C1, C2, C3, and C4. The compressed data block 30 may be of a fixed size regardless of a number of bits in the block of bits.

Establishing and Re-Establishing the Integer Values of the Registers During the Encoding of Each Bit As noted, the registers P1, P2, P3, P4, P1.1, and P1.2 may contain integer values with predetermined properties prior to encoding each bit of the block of bits. The predetermined properties may be based on the factor F, F1, and/or F2.

For example, when encoding a first bit of the block of bits as an even integer or an odd integer, registers P1 may be established as the integer value defined by the following expression:

$$P1 = (((S-1) \times (F2+F)) + S \times F2) + C, \quad (1)$$

where F, F1, and F2 are as defined above and S is the predetermined number of bits, e.g., 1024, in the block of bits 26. C may be a correction factor that is added to integer value of P1. If the integer factor F is greater than two, then C may be equal to F1. Alternatively, if the integer factor F is less than or equal to two, then C may be set to zero.

The integer value of registers P2, P3, P4 may take similar values. The integer value for these registers may be set to zero for the encoding of a first bit of the block of bits 26, but other arrangements are also possible. For example, the integer value of P3 and P4 may depend on whether P3 and P4 are incremented or decremented as the single bit is encoded as the even value or the odd value. If P3 and P4 are incremented, for example, then the integer values of P3 and P4 may be set to a zero integer value. On the other hand, if P3 and P4 are decremented, then the integer value of P3 and P4 may be set to a non-zero value, e.g., a maximum integer value that can be stored in registers P3 and P4. Then, the first bit of the block of bits 26 may be encoded, by determining whether the first bit is a one or a zero and representing the one or the zero as the odd or even integer of the data array 54.

The integer value of the data array, i.e., registers P1.1 and P1.2 may be established based on the integer value of register P1. The integer value of the integer register P1.2 may be established as follows:

$$P1.2 = ((P1 \times B) - (F+1))/F$$

where P1 is the integer value of register P1, B may equal 2, and the encoder 16 may be programmed with the factor F. As a result of establishing the register P1.2, the integer value of P1.2 may be an even value.

The integer register P1.1 may be set as the integer value of register P1.2, as calculated above, minus one. The integer register P.1.1 may be established to be an odd value for the encoding of the first bit. Other arrangements are also possible depending on the predetermined characteristic defined to encode the bits in the block of bits.

After the first bit is encoded and as one or more bits are encoded, the integer values of registers P1 and P2 may be re-established to maintain the predetermined properties. Additionally, the integer value of P1 may be adjusted so that the integer value of P1 does not grow quickly large as the bits in the block of bits are encoded. The integer values of P1 and P2 may be adjusted to the integer values as defined below, as a result of an empirical determination.

After encoding the first bit and as one or more bits are encoded as the even or odd integer, an odd value O may be calculated to re-establish the register P1 prior to encoding a next bit. The odd value O may be based on the odd or even value of the data array that was selected for the bit that was just encoded. The odd value, O, may be defined by an odd integer value given by the following expression:

$$O = (\text{Encoded\_Value} \times F - (F+1))/B \qquad (2)$$

where Encoded_Value is the odd or even integer value of the data array 54 that was selected for the bit that was just encoded and F is the factor with which the encoder 16 is programmed. B may be an integer, which results in equation 2 yielding an odd value. B may be equal to two, but B may take on other values, for example, when the bits are not encoded as odd or even integers.

The integer value of P1 may be set to the odd integer value O prior to encoding the next bit. Preferably, however, the odd value O may then be reduced by the even value E so that the integer value of P1 does not quickly grow large (or small, if the integer value of P1 is decremented as each bit is encoded). The even value, E, may be defined by an even integer value given by the following expression:

$$E = (((((\text{Initial\_}P1 - P3 \times F1) - P4 \times F2) + P2) \times B) - (F+1))/F \qquad (3)$$

where Initial_P1 is the integer value of P1 prior to when the first bit of the block of bits is encoded. Additionally, P2, P3, and P4 may be the integer values of registers P2, P3, and P4 respectively, prior to encoding the next bit. The encoder 16 may be programmed with the integer factor F. And B may be the same integer value, e.g., two, which was used to compute the odd value O.

The processor 56 may use the odd value O and the even value E (defined by equations 2 and 3) to re-establish the integer value of register P1 for encoding the next bit. For encoding the next bit, the integer value of integer register P1 may be set as follows:

$$P1 = (((( O - E ) + 1) \times F ) + R + F )/B$$

where O is the odd value, E is the even value, and F is the factor with which the encoder 16 is programmed. R may be a correction factor to account for the remainders lost as a result of integer divisions by equations 2 and 3. R, for example, may equal two. And B may equal 21, but B may take on other values, for example, if the bits are not encoded as odd or even integers. As a result of the above calculation, the integer value of P1 may be equal to the integer value of P1 prior to it being re-established plus or minus the factor F, but other arrangements are also possible.

The register P2 may be re-established for the next bit to be encoded based on whether the bit that was encoded was a one or a zero. If the bit that was encoded was a zero, then the integer value of register P2 may be incremented by a sum of the integer factors F1 and F. Alternatively, if the bit that was encoded was a one, then the register P2 may be incremented by the integer factor F and the integer factor F2.

Additionally, if a difference between the integer value in register P3 and the integer value in P4 is one and the integer value of both register P3 and register P4 is greater than one, then the integer value of register P2 may be further incremented by the factor F2 and F. Alternatively, if the difference is one and the integer value of register P3 value or the integer value of P4 is equal to one, then the integer value of P2 may be further incremented by F1 and F. Yet alternatively, if the integer value in register P3 is greater than the integer value in P4, then the integer value of register P2 may be further incremented by the factor F1 and the factor F. Alternatively, if the integer value of register P3 is less than the integer value in P4, then the integer value of register P2 may be further incremented by the factor F2 and the factor F. Still alternatively, if the integer value of the register P3 is equal to the integer value in P4, then the integer value of P2 may be further incremented by the factor F1 and the factor F.

The integer value of the data array, i.e., registers P1.1 and P1.2 may be reestablished based on the integer value of register P1. The integer value of the integer register P1.2 may be re-established as follows:

$$P1.2 = ((P1 \times 2) - (F+1))/F$$

where P1 is the integer value of register P1 and the encoder 16 may be programmed with the factor F. As a result of re-establishing the register P1.2, the integer value of P1.2 may be an even value.

The integer register P1.1 may be set as the integer value of register P1.2, as calculated above, minus one. The integer register P.1.1 may be re-established as an odd value for the encoding of the next bit. Other arrangements are also possible. For example, P.1.2 may be re-established by calculation and P.1.1 may be decremented or incremented by one.

The steps of parsing the next bit from the block of bits 26, encoding the bit, and adjusting the registers may continue until the bits in the block of bits 26 are encoded.

The Decoder For Decoding the Compressed Data Block

Figure 3:
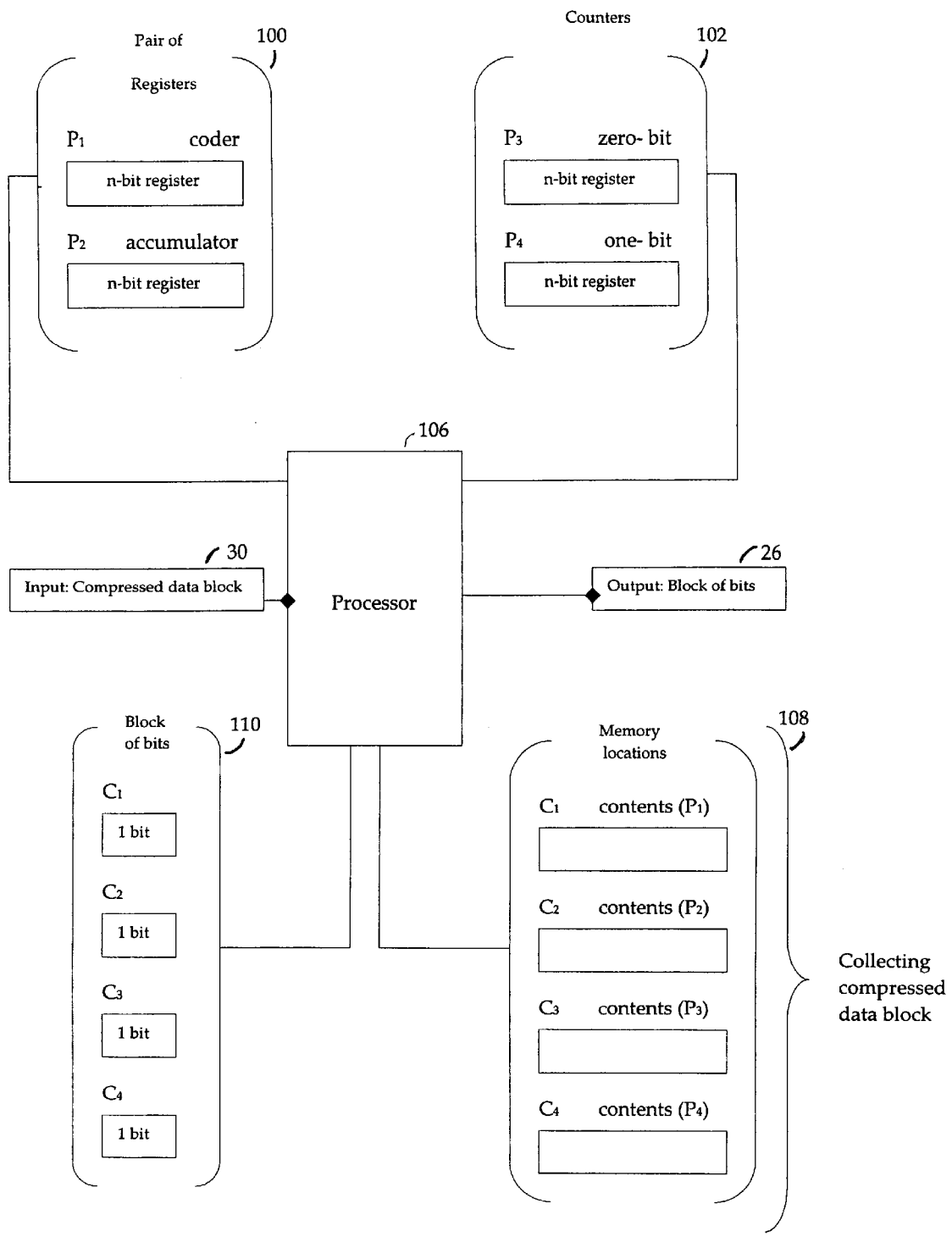
FIG. 3 is an overview of an internal architecture for a decoder that decodes the compressed data blocks into the blocks of bits.

FIG. 3 is an overview of an exemplary architecture for the decoder 22. Like the encoder 26, the decoder may have a processor 106, a pair 100 of registers P1 and P2, and counter registers identified as P3 and P4. Similar to the encoder 22, the registers P1, P2, P3, and P4 may be storage devices, e.g., integer registers, memory locations, floating point registers, which store integer values. The processor 106 may use the registers to decode the compressed data blocks 30 generated by the encoder 16 into the blocks of bits 28.

The memory 108 may store integer value defining the compressed data block 30. The parser 20 may parse the bit stream 18 into the compressed data blocks 30.

As noted above, the compressed data block 30 may define the block of bits 26. The decoder may initialize the registers P1, P2, P3, and P4 with the integer values of the compressed data block 30 prior to decoding the block of bits from the compressed data block 30.

The integer value of integer register P1 may have integer values with or without the predefined characteristic used to encode the bits in the block of bits 26. As noted above, the predefined characteristic may simulate a base-two condition of the bit that was encoded. For example, the integer value of P1 may be the even integer value or the odd integer value used to encode a bit from the block of bits defined by the compressed data block. Alternatively, the integer value of P1 may be a multiple of a number or not a multiple of the number. Furthermore, the integer value of P2 may store adjustments made to integer register P1 during the decoding of each bit. And the plurality of registers P3 and P4 may keep a count of the bits, which are zero and one, respectively, that are decoded.

Similar to the encoder 16, the processor 106 may be programmed to maintain predetermined properties for the integer values of registers P1 and P2 during the decoding of the compressed data block 30. The integer value of P1 may be a multiple of the integer factor F plus the integer factor F minus one. On the other hand, the integer value of P2 may be the multiple of the integer factor F.

Additionally, the processor 106 may be programmed to define integer factors F1 and F2. The integer factor F1 may be two times the integer factor F. And the integer factor F2 may be three times the integer factor F.

The processor 106 may use the integer values of P1, P2, P3, and P4 to decode each bit from the compressed data block. Each bit may be decoded in accordance with the binary condition of the numbers used to encode the block of bits 26. For example, the processor 106 may decode a single bit with a one value if the integer value in register P1 is an odd integer value. On the other hand, the processor 106 may decode a single bit with a zero value if the integer value of register P1 is an even integer value. Additionally, the single bit, i.e., zero bit or one bit, may be stored in memory 110, for example, as part of the block of bits that is decoded and then output as the block of bits 26. Other arrangements are also possible.

The integer value of registers P3 or P4 may be adjusted in accordance with the bit decoded. If a zero bit was decoded, then register P3 may be decremented by one. And if a one-bit was decoded, then the integer value of register P4 may be decremented by one. Again, other arrangements are also possible.

Establishing and Re-Establishing the Integer Values of the Registers During the Decoding of Each Bit As noted, the integer values of registers P1 and P2 may have predetermined properties prior to encoding each bit of the block of bits. The decoder 22 may be programmed with the integer factors F, F1, and F2 of which the predetermined properties are based.

When decoding a first bit of the block of bits, the integer value of registers P1, P2, P3, and P4 may be established to equal the integer values defined by the compressed data block 30. For example, memory 108 may store the integer values of the compressed data block. The processor 106 may set the register P1 to the integer value of C1, the integer register P2 set to the integer value of C2, the integer register of P3 set to the integer value of C3, and the integer value of P4 set to the integer value of C4. Then, the decoder may decode a single bit from the integer values of P1, P2, P3, and P4.

After one or more bits are decoded, the integer values of registers P1 and P2 may be re-established to maintain the predetermined properties of the registers. The predetermined properties may be maintained to match operation of the encoder during the encoding of the block of bits. For example, when the binary condition used to encode the block of bits 26 is an odd integer value or an even integer value, then the integer value of register P1 may be re-established by calculating an odd value O, and also if P1 is adjusted by the encoder 22 to control growth, an even value E, prior to decoding a next bit.

The odd value, O, may be an odd integer value defined by the following expression:

$$O = ((P1 \times 2 - (F+1))/F) - 1 \quad (4)$$

where P1 may be the integer value of P1 after the bit is decoded, but prior to decoding the next bit. And the processor 106 may be programmed with the integer factor F.

The even value, E, may be an even integer value defined by the following expression:

$$E = (((\text{Initial}_{13}\ P1 - P3 \times F1) - P4 \times F2 + P2) \times B - (F+1))/F \quad (5)$$

where Initial_P1 may be the integer value of P1 prior to encoding the first bit of the block of bits defined by the compressed data block. P2, P3, and P4 may be the integer value of P1, P2, P3, and P4, respectively, prior to decoding the next bit. F, F1, and F2 may be factors with which the processor 106 is programmed and B may be an integer, which results in equation 5 yielding an even value. B may be equal to two, but B may take on other values, for example, if the bits are not encoded as odd or even integers.

Using the odd value O and the even value E, the processor 106 may determine the integer value of P1 for decoding of the next bit. The integer value of the register P1 may be defined by the following expression:

$$P1 = ((O+E) \times B + C + F)/F$$

where O is the odd value and E is the even value defined by equations 4 and 5, respectively, and F is the factor programmed into the decoder 22. B may be equal to two when the bit in the block of bits 26 is encoded as the even integer value or the odd integer value. And C may be a correction factor added to P1 to account for remainders lost during the integer divisions of equations 4 and 5. Other arrangements, however, are also possible.

If the integer value of the register P1 was odd, e.g., one bit was decoded, then the integer value of P1 may be further adjusted prior to decoding the next bit. The integer value of P1 may be incremented by one to yield an even integer value and further adjusted as follows:

$$P1 = (P1 \times F + C + F)/B$$

where P1 is the integer value of the register P1, an odd value. Again, C and B may be integer values, e.g., 2, specific to bits which are encoded as odd and even integer values.

Like register P1, the integer value of register P2 may be re-established after decoding the single bit. If there are no bits left to be decoded (e.g., P3 and P4 is zero), then the integer value of register P2 may be set to zero.

If a difference between the integer value in register P3 and the integer value in P4 is one and the integer value of both register P3 and register P4 is greater than one, then the integer value of register P2 may be decremented by the factor F2 and F. Alternatively, if the difference is one and the integer value of P3 or the integer value of P4 is equal to one, then the integer value of P2 may be decremented by F1 and F. Yet alternatively, if the integer value in register P3 is greater than the integer value in P4, then the integer value of register P2 may be decremented by the factor F1 and the factor F. Alternatively, if the integer value of register P3 is less than the integer value in P4, then the integer value of register P2 may be decremented by the factor F2 and the factor F. Still alternatively, if the integer value of the register P3 is equal to the integer value in P4, then the integer value of P2 may be decremented by the factor F1 and the factor F.

Using the integer values of P1, P2, P3, and P4, the processor may decode the next bit of the compressed block. The process of re-establishing the integer values of the registers may continue until there are no more bits to decode, as indicated by registers P3 and P4 being equal to zero or some maximum integer value (depending on whether the integer values of P3 and P4 are decremented or incremented, respectively, as each bit is decoded).

The expressions that define the integer values of the registers of the encoder 16 and the decoder 22 are exemplary in nature. Other integer values empirically determined using other expressions may be used to establish and re-establish the integer values of the registers so as to maintain the predetermined properties for encoding and decoding the block of bits 26 and compressed data block 30, respectively.

Exemplary embodiments of the present invention have thus been illustrated and described. It will be understood, however, that changes and modifications may be made to the invention as described without deviating from the spirit and scope of the invention, as defined by the following claims.

I claim:

1. A data encoding method for an encoder, the data encoding method comprising:
   obtaining a bit;
   determining whether the bit is equal to a zero or a one;
   if the bit is equal to the zero, then selecting a first integer value from a data array, the first integer value having a predefined characteristic;
   if the bit is equal to the one, then selecting a second integer value from the data array, the second integer value not having the predefined characteristic,
   whereby the encoder uniquely encodes the bit as the first integer value that has the predefined characteristic or the second integer value that does not have the predefined characteristic.

2. The data encoding method of claim 1, wherein the predefined characteristic is selected from the group consisting of evenness and oddness.

3. The data encoding method of claim 2, wherein the first integer value is odd and the second integer value is even.

4. The data encoding method of claim 2, wherein the first integer value is even and the second integer value is odd.

5. The data encoding method of claim 1, wherein the bit is parsed from a block of bits.

6. The data encoding method of claim 1, wherein the encoder has at least one register, the at least one register capable of storing a maximum integer value greater than or equal to a number of bits in the block of bits.

7. The data encoding method of claim 1, wherein the encoder has at least one register, the at least one register storing at least one integer value, the method further comprising:
   re-establishing the at least one integer value to be at least one new integer value, the at least one register being re-established with the at least one new integer value in response to selection of the first integer value or the second integer value from the data array;
   computing a new first integer value and a new second integer value from the at least one new integer value, the new first integer value having the predefined characteristic and the new second integer value not having the predefined characteristic;
   storing the new first integer value and the new second integer value in the data array;
   whereby the new first integer value or the new second integer value of the data array is selected to encode a next bit.

8. The method of claim 7, wherein re-establishing the at least one integer value to be the at least one new integer value comprises:
   adjusting one of the at least one integer value by a predefined integer value if the bit is equal to one; and
   adjusting the one of at least one integer value by another predefined integer value if the bit is equal to the zero,
   whereby the one of at least one integer value accumulates adjustments made to produce one of the at least one new integer value from another of the at least one integer value.

9. The method of claim 8, wherein adjusting the one of the at least one integer value comprises decrementing the one of the at least one integer value.

10. The method of claim 8, wherein adjusting the one of the at least one integer value comprises incrementing the one of the at least one integer value.

11. The data encoding method of claim 8, wherein (i) the at least one register comprises a plurality of counters and (ii) re-establishing the at least one integer value with the at least one new integer value comprises:
    adjusting a first counter value of the plurality of counters if the bit is equal to the zero;
    adjusting a second counter value of the plurality of counters if the bit is equal to the one,
    whereby the first counter value and the second counter value collectively count a number of bits equal to the zero and a number of bits equal to the one, respectively; and
    adjusting the other of the at least one integer value by the first counter value, the second counter value, and the one of at least one integer value so as to produce the one of the at least one new integer value.

12. The data encoding method of claim 11, wherein adjusting the first counter and the second counter comprise incrementing the first counter and the second counter, respectively.

13. The data encoding method of claim 11, wherein adjusting the first counter and the second counter comprise decrementing the first counter and the second counter, respectively.

14. The data encoding method of claim 7, wherein at least one new integer value has predetermined properties, the predetermined properties being selected from the group consisting of (i) a multiple of an integer factor and (ii) the multiple of the integer factor adjusted by an integer value less than the integer factor.

15. The data encoding method of claim 14, wherein the integer factor is non-zero.

16. A data encoding method for an encoder, the data encoding method comprising:
    determining for each bit in a block of bits whether the bit is equal to a zero or to a one;
    selecting, for each bit in the block of bits that is equal to the zero, a first integer value from a data array, the first integer value having a predefined characteristic;
    selecting, for each bit in the block of bits that is equal to the one, a second integer value from the data array, the second integer value not having the predefined characteristic;
    outputting a compressed data block, the compressed data bock having a fixed number of bits, the fixed number of bits defining the first integer value or the second integer value selected for the each bit in the block of bits,
    whereby a decoder can decode the block of bits from the compressed data block.

17. The data encoding method of claim 16, wherein the block of bits is a previously compressed data block.

18. A data decoding method for a decoder, the data decoding method comprising:
    determining whether or not a given integer value has a predefined characteristic;
    if the given integer value has the predefined characteristic, then outputting a zero bit;
    if the given integer value does not have the predefined characteristic, then outputting a one bit;

whereby the decoder uniquely decodes the zero bit or the one bit from the given integer value.

19. The data decoding method of claim 18, wherein the predefined characteristic is selected from the group consisting of evenness and oddness.

20. The data decoding method of claim 19, wherein the given integer value is an odd integer value.

21. The data decoding method of claim 19, wherein the given integer value is an even integer value.

22. The data decoding method of claim 18, further comprising receiving a compressed data block, the compressed data block having at least one integer value defined by predetermined properties, whereby the decoder decodes a block of bits from the at least one integer value.

23. The data decoding method of claim 22, wherein the predetermined properties of the at least one integer value is selected from the group consisting of (i) a multiple of an integer factor and (ii) the multiple of the integer factor adjusted by an integer value less than the integer factor.

24. The data decoding method of claim 23, wherein the integer factor is nonzero.

25. The data decoding method of claim 18, wherein the decoder has at least one register, the at least one register storing at least one integer value, the method further comprising:

re-establishing the at least one integer value to be at least one new integer value, the at least one register being re-established to be the at least one new integer value in response to outputting the zero bit or the one bit;

whereby a next bit can be decoded from the compressed data block by determining whether or not one of the at least one new integer value has the predetermined characteristic.

26. The data decoding method of claim 25, wherein re-establishing the at least one integer value to be at least one new integer value comprises adjusting one of at least one integer value by a predefined integer value, whereby the one of at least one integer value accumulates adjustments made to another of the at least one integer value so as to produce the one of the at least one new integer value.

27. The data decoding method of claim 26, wherein (i) the at least one register comprises a plurality of counters and (ii) re-establishing the at least one integer value to be the at least one new integer value comprises:

adjusting a first counter value of the plurality of counters if the zero bit is outputted;

adjusting a second counter value of the plurality of counters if the one bit is outputted, whereby the first counter value and the second counter value collectively count a number of zero bits and a number of one bits outputted, respectively; and adjusting the other of the at least one integer value by the first counter value, the second counter value, and the one of the at least one integer value so as to produce the one of at least one new integer value.

28. The data decoding method of claim 27, wherein adjusting the first counter and the second counter comprise incrementing the first counter and the second counter, respectively.

29. The data decoding method of claim 27, wherein adjusting the first counter and the second counter comprise decrementing the first counter and the second counter, respectively.

30. A data decoding method for a decoder, the data decoding method comprising:

receiving a compressed data block that defines a plurality of integer values;

determining, for each integer value of the plurality of integer values, whether the integer value has a predefined characteristic;

if the integer value has the predefined characteristic, then outputting a zero bit;

if the integer value does not have the predefined characteristic, then outputting a one bit;

whereby the decoder uniquely decodes the compressed data block to produce a block of bits defined by one bits and zero bits.

31. A system comprising:

a processor;

memory; and computer instructions stored in the memory and executable by the processor to perform the functions of:

obtaining a bit;

determining whether the bit is equal to a zero or a one;

if the bit is equal to the zero then selecting a first integer value from the memory, the first integer value having a predefined characteristic;

if the bit is equal to the one, then selecting a second integer value from the memory, the second integer value not having the predefined characteristic, whereby the bit is uniquely encoded as the first integer value or the second integer value of the data array.

32. A system comprising:

a processor;

memory; and computer instructions stored in the memory and executable by the processor to perform the functions of:

determining, for each bit in a block of bits, whether the bit is equal to a zero or to a one;

selecting, for each bit in the block of bits that is equal to the zero, a first integer value from a data array, the first integer value having a predefined characteristic;

selecting, for each bit in the block of bits that is equal to the one, a second integer value from the data array, the second integer value not having the predefined characteristic;

outputting a compressed data block, the compressed data bock having a fixed number of bits, the fixed number of bits defining the first integer value or the second integer value selected for the each bit in the block of bits, whereby the block of bits can be decoded from the compressed data block.

33. A system comprising:

a processor;

memory; and computer instructions stored in the memory and executable by the processor to perform the functions of:

determining whether or not a given integer value has a predefined characteristic;

if the given integer value has the predefined characteristic, then outputting a zero bit;

if the given integer value does not have the predefined characteristic, then outputting a one bit, whereby the decoder uniquely decodes the zero bit or the one bit from the given integer value.

34. A system comprising:

a processor;

memory; and computer instructions stored in the memory and executable by the processor to perform the functions of:
- receiving a compressed data block that defines a plurality of integer values;
- determining, for each integer value of the plurality of integer values, whether the integer value has a predefined characteristic;
- if the integer value has the predefined characteristic, then outputting a zero bit;
- if the integer value does not have the predefined characteristic, then outputting a one bit, whereby the decoder uniquely decodes the compressed data block to produce a block of bits defined by one bits and zero bits.

* * * * *